United States Patent
Copperthite (10) Patent No.: US 8,141,765 B2
(45) Date of Patent: Mar. 27, 2012

(54) CUTTING BLADE FOR A WIRE BONDING SYSTEM

(75) Inventor: Theodore J. Copperthite, Laguna Hills, CA (US)

(73) Assignee: Orthodyne Electronics Corporation, Irvine, CA (US)

(*) Notice: Subject to any disclaimer, the term of this patent is extended or adjusted under 35 U.S.C. 154(b) by 0 days.

(21) Appl. No.: 13/144,003

(22) PCT Filed: Jan. 4, 2010

(86) PCT No.: PCT/US2010/020024
§ 371 (c)(1),
(2), (4) Date: Jul. 11, 2011

(87) PCT Pub. No.: WO2010/090778
PCT Pub. Date: Aug. 12, 2010

(65) Prior Publication Data
US 2011/0266331 A1    Nov. 3, 2011

Related U.S. Application Data

(60) Provisional application No. 61/145,813, filed on Jan. 20, 2009.

(51) Int. Cl.
*B23K 37/00* (2006.01)
*B23K 31/02* (2006.01)
(52) U.S. Cl. .................... 228/4.5; 228/13; 228/180.5
(58) Field of Classification Search ............... None
See application file for complete search history.

(56) References Cited

U.S. PATENT DOCUMENTS

| | | | | |
|---|---|---|---|---|
| 4,619,397 A | * | 10/1986 | Urban | 228/111 |
| 4,976,392 A | * | 12/1990 | Smith et al. | 228/102 |
| 5,018,658 A | * | 5/1991 | Farassat | 228/4.5 |
| 5,029,747 A | | 7/1991 | Russo et al. | |
| 5,190,206 A | * | 3/1993 | Miller et al. | 228/102 |
| 5,365,657 A | * | 11/1994 | Brown et al. | 29/850 |
| 5,425,833 A | | 6/1995 | Fujimoto et al. | |
| 6,206,275 B1 | * | 3/2001 | Biggs | 228/180.5 |
| 6,276,588 B1 | * | 8/2001 | Johnson | 228/13 |
| 6,827,248 B2 | * | 12/2004 | Farassat | 228/4.5 |
| 7,578,422 B2 | * | 8/2009 | Lange et al. | 228/1.1 |
| 7,762,449 B2 | * | 7/2010 | Cheng et al. | 228/180.5 |
| 2004/0011848 A1 | * | 1/2004 | Farassat | 228/1.1 |
| 2005/0247755 A1 | * | 11/2005 | Laurent et al. | 228/101 |
| 2006/0157537 A1 | * | 7/2006 | Walther | 228/102 |
| 2006/0278682 A1 | * | 12/2006 | Lange et al. | 228/4.5 |
| 2007/0181652 A1 | * | 8/2007 | Lange et al. | 228/101 |
| 2010/0127045 A1 | * | 5/2010 | Cheng et al. | 228/104 |

FOREIGN PATENT DOCUMENTS

| JP | 06-349901 | | 12/1994 |
|---|---|---|---|
| JP | 10-41334 A | * | 2/1998 |
| JP | 2001-352030 | | 12/2001 |

OTHER PUBLICATIONS

International Search Report for International Patent Application No. PCT/2010/020024, dated Jul. 26, 2010.

* cited by examiner

*Primary Examiner* — Kiley Stoner
(74) *Attorney, Agent, or Firm* — Christopher M. Spletzer, Sr.

(57) ABSTRACT

A cutting blade for a wire bonding system is provided. The cutting blade comprises a body portion having an end portion. The end portion includes a blade tip configured to penetrate into a conductive material The end portion further includes a stepped portion proximate the blade tip that is configured to limit penetration of the blade tip during use thereof.

20 Claims, 11 Drawing Sheets

CUTTING BLADE FOR A WIRE BONDING SYSTEM

CROSS-REFERENCE TO RELATED APPLICATIONS

This application claims the benefit of the International Patent Application No. PCT/US2010/020024 filed on Jan. 4, 2010, which claims the benefit of U.S. Provisional Application No. 61/145,813, filed Jan. 20, 2009, the content of which is incorporated herein by reference.

FIELD OF THE INVENTION

The present invention relates to wire and ribbon bonding operations, and more particularly, to cutting blades used in connection with such operations.

BACKGROUND OF THE INVENTION

In the processing and packaging of semiconductor devices, wire and ribbon bonding continues to be a widely used method of electrical interconnection between two locations within a package (e.g., between a die pad of a semiconductor die and a lead of a leadframe). In connection with the formation of wire and/or ribbon loops in certain applications, a cutting portion may be used to cut into the conductive material (e.g. wire or ribbon) to assist in severing the completed wire or ribbon loop from the wire or ribbon supply. U.S. Pat. No. 4,976,392, which relates to wire bonding systems, discloses use of such a cutting portion and is incorporated by reference herein in its entirety.

Figure 1:
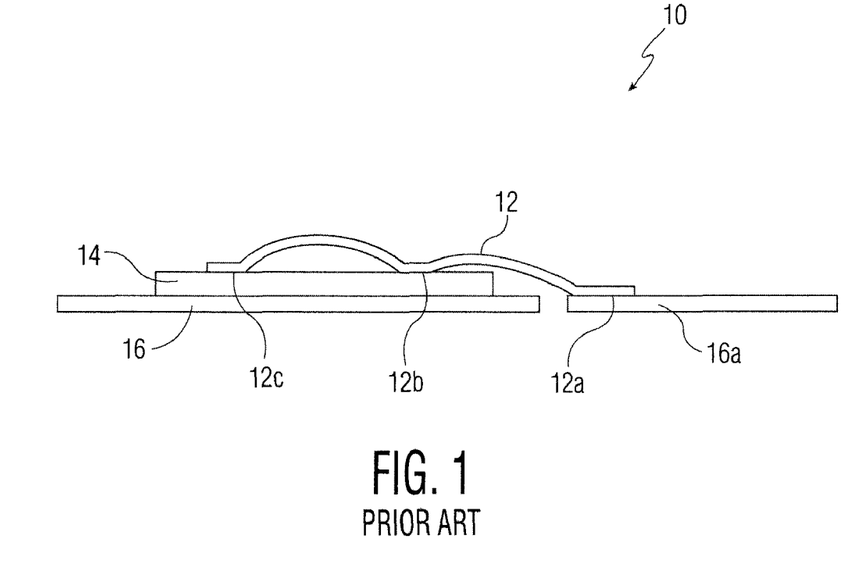
FIG. 1 is a side sectional view of a semiconductor package including a ribbon or wire loop.

FIG. 1 illustrates exemplary semiconductor package 10 including semiconductor die 14 which is supported by substrate 16 (e.g. a copper leadframe 16 or other die support structure). Wire or ribbon loop 12 (i.e., conductive material 12) provides electrical interconnection between die 14 and lead 16a of substrate 16. In the example device shown in FIG. 1, wire loop 12 is bonded twice to die 14 (at bonded portions 12b and 12c) and once to lead 16a (at bonded portion 12a).

While most conventional wire bonding sequences form a first bond on a die, and a final bond on a substrate/leadframe, reverse bonding operations are also known. During an exemplary reverse wire (or ribbon) bonding operation, a first bond is formed on lead 16a, thereby forming bonded portion 12a. Then a length of wire is extended towards die 14 where a second bond is formed (bonded portion 12b) on a portion of die 14 (e.g., on a die pad). The wire is further extended to another location on die 14 (bonded portion 12c). After formation of bonded portion 12c, it is desirable to cut the wire to separate the now formed wire loop 12 from the wire supply. A cutting blade is desirably used to at least partially cut through the wire after formation of bonded portion 12c. However, during the cutting of the wire it is possible that the cutting blade may pierce and/or damage a portion of underlying die 14.

Figure 2A:
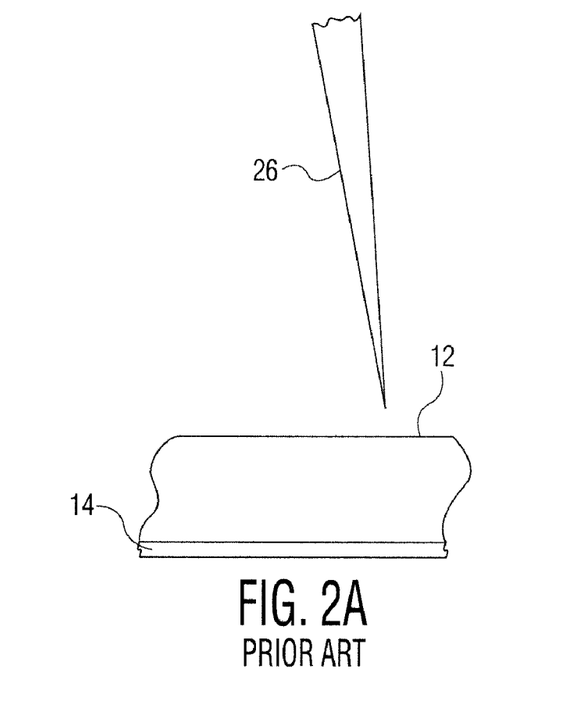
FIGS. 2A and 2B are side sectional views of a conventional blade tip prior to and after cutting through a conductive material and into the underlying structure.
Figure 2B:
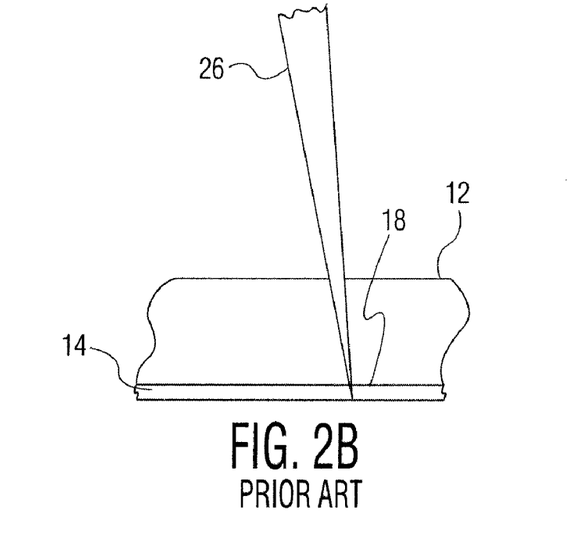

More specifically, in FIG. 2A, conventional cutting blade 26 within a wire bonding system is shown in a position prior to contact with wire or ribbon loop 12. FIG. 2B illustrates cutting blade 26 having pierced loop 12 and continuing to contact/pierce at least a portion of underlying semiconductor die 14 at, for example, bonding location 18. Such contact/piercing of die 14 may cause a defect leading to poor performance or operational problems.

Thus, it would be desirable to provide improved cutting blades and associated wire bonding systems.

SUMMARY OF THE INVENTION

According to an exemplary embodiment of the present invention, a cutting blade for a wire bonding system is provided. The cutting blade includes a body portion having an end portion. The end portion includes a blade tip configured to penetrate into a conductive material The end portion further includes a stepped portion proximate the blade tip configured to limit penetration of the blade tip during use thereof.

According to another exemplary embodiment of the present invention, a wire bonding system is provided. The wire bonding system includes a bonding tool for bonding a conductive material to a bonding location and a cutting blade adjacent the bonding tool. The cutting blade includes a body portion having an end portion. The end portion includes a blade tip configured to penetrate into the conductive material after the conductive material has been bonded to the bonding location. The end portion further includes a stepped portion proximate the blade tip configured to limit the penetration of the blade tip during use thereof.

According to yet another exemplary embodiment of the present invention, a method of bonding a conductive material to a bonding location is provided. The method includes the steps of bonding a conductive material to a bonding location and providing a cutting blade configured to penetrate the conductive material. The cutting blade includes a body portion having an end portion. The end portion includes a blade tip configured to penetrate into the conductive material. The end portion further includes a stepped portion proximate the blade tip configured to limit the penetration of the blade tip during use thereof. The method also includes the step of pressing the blade tip into the conductive material to penetrate the conductive material.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

According to an exemplary embodiment of the present invention, the end portion of a cutting blade of a wire or ribbon bonding system includes a stepped portion proximate a blade tip. The stepped portion is configured to limit the penetration of the blade tip into a conductive material such as a wire or ribbon during use of the cutting blade in the formation of respective wire or ribbon bonds. The stepped portion may be referred to as a resistance portion or a retarding portion as it may resist, or retard, penetration of the blade tip into a conductive material. The term "stepped portion" is not limiting as to its shape. By limiting penetration of the blade tip, reverse bonding is made more practical as the final bond of the wire loop may be formed on the semiconductor die while the die is protected from penetration.

The terms "wire", "ribbon", and "conductive material" are used herein to generically describe the material bonded by a wire bonding system. It is understood that a wire bonding system may bond a wire material, or a ribbon material, as is desired in the given application. Thus, it is understood that these terms are used interchangeably and are not intended to be limiting with respect to one another.

Figure 3:
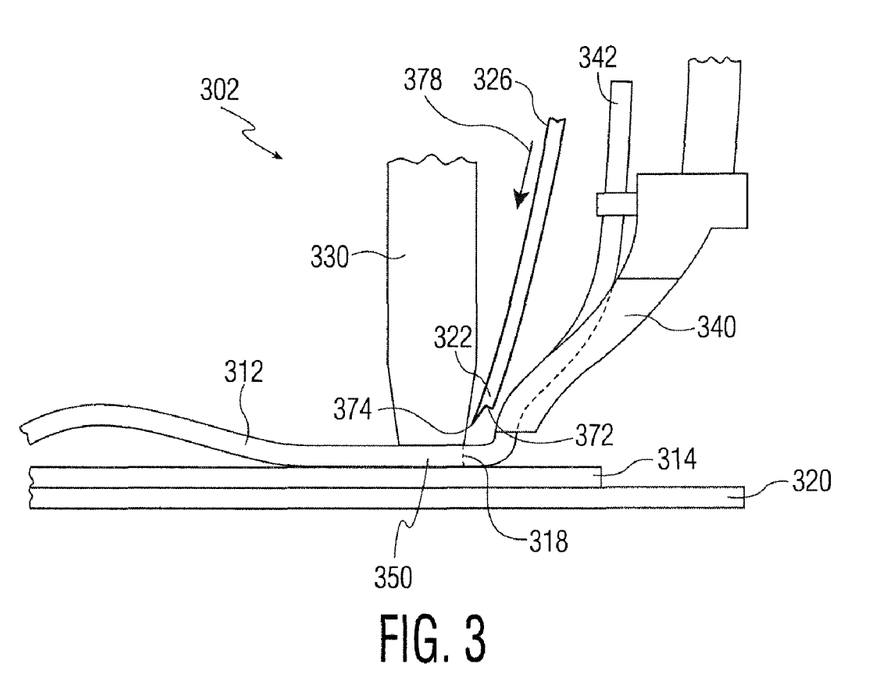
FIG. 3 is a side sectional view of elements of a wire bonding system in accordance with an exemplary embodiment of the present invention.

FIG. 3 is a side sectional view of a portion of wire bonding system 302 including cutting blade 326 (having an improved end portion 322) positioned, for example, between bonding tool 330 and wire or ribbon conduit/guide 340. Guide 340 provides wire or ribbon 342 to bonding tool 330 (e.g., a wedge bonding tool) to permit formation of bonded wire 312. Bonded wire 312 may be a conductive material that provides electrical interconnection between semiconductor die 314 and substrate 320 (e.g., leadframe 320). In FIG. 3, a first bond (not shown) has already been formed on a bonding location of substrate 320, and second bond 350 has been formed on die 314. It is desired to at least partially cut wire 342 at or near position 318 to assist in the separation of bonded wire loop 312 from wire supply 342.

As is known to those skilled in the art, the upper terminal end of bonding tool 330 is configured to be engaged in a transducer (e.g., an ultrasonic transducer) of wire bonding system 302. The terminal end of bonding tool 330 is configured to form wire bonds or ribbon bonds (e.g., such as second bond 350 shown in FIG. 3).

Cutting blade 326 may be any cutting blade according to the present invention (including but not limited to those shown in FIGS. 4A-4C, 5A-5B, 6A-6B, 7A-7B, 8A-8B, and 9A-9B) and may be manufactured of any of a number of materials such as cutting steel. As is illustrated in FIG. 3, cutting blade 326 includes stepped portion 372 proximate blade tip 374.

As shown in FIG. 3, blade tip 374 is proximate bonding tool 330 with stepped portion 372 facing guide 340. The proximity of blade tip 374 to the edge of bonding tool 330 may desirably enhance an accurate and precise cut into wire/ribbon 312 at position 318 when downward cut force 378 is applied.

It is noted that while bonding system 302 includes bonding tool 330 and wire guide 340 with cutting blade 326 positioned between bonding tool 330 and guide 340 (a so-called rear cut system), it is also possible to position cutting blade 326 in other locations relative to the tool and guide. For example, cutting blade 326 may be positioned to the left of bonding tool 330 in FIG. 3 (with guide 340 remaining to the right of bonding tool 330) (a so-called front cut system). In such as case, it may be desirable to move cutting blade 326 to the right of second bond 350 before cutting or penetrating into bonded wire loop (i.e., conductive material 312) at position 318.

Figure 4A:
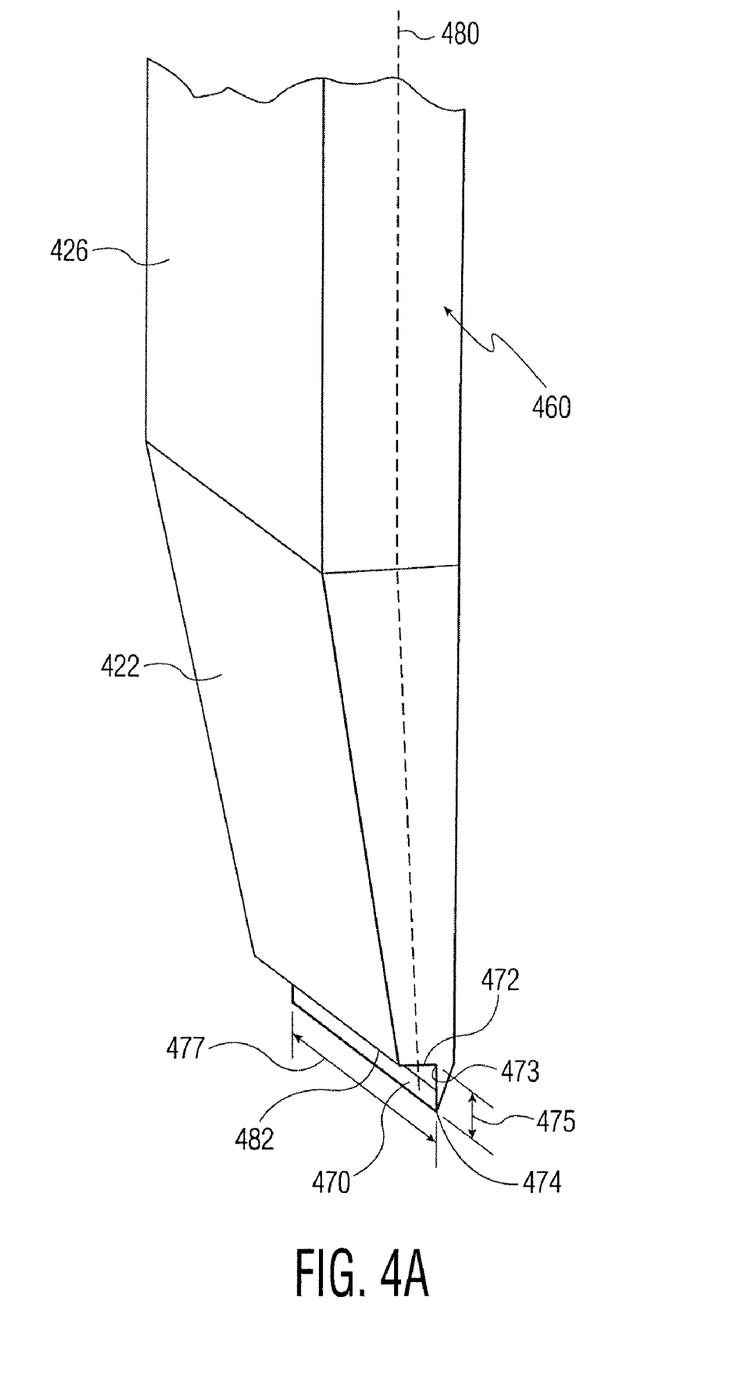
FIG. 4A is an enlarged perspective view of an end portion of a cutting blade in accordance with an exemplary embodiment of the present invention.

FIG. 4A is an enlarged perspective view of end portion 422 of cutting blade 426. Cutting blade 426 includes body portion 460, where body portion 460 includes end portion 422. End portion 422 includes cutting portion 470 that terminates at blade tip 474. End portion 422 also includes stepped portion 472 which defines stepped surface 482 (which is configured to contact the conductive material during penetration) that is substantially perpendicular to longitudinal axis 480 of cutting blade 426. Stepped portion 472 is distanced relative to blade tip 474 by height 475, where height 475 relates to depth 476 (see FIG. 4B) that blade tip 474 penetrates into conductive material 412 (e.g., wire or ribbon 412).

Exemplary juncture/interface 473 (between stepped surface 482 and an inner wall of cutting portion 470) may be between 70-110 degrees, and in FIG. 4A is illustrated to be approximately 90 degrees. Height 475 from blade tip 474 to stepped surface 482 may be determined, for example, based on the thickness of wire/ribbon 412 and desired cutting depth 476. In one exemplary embodiment, height 475 may be between 50 to 100% of the thickness of wire or ribbon 412. In another exemplary embodiment, height 475 may be between 70 to 90% of the thickness of wire or ribbon 412 (with a specific application of approximately 80%). In such an application, if wire/ribbon 412 has a thickness of 0.20 mm, height 475 may be approximately 0.16 mm. Of course, the various exemplary stepped portions in FIGS. 5A-5B, 6A-6B, 7A-7B, 8A-8B, and 9A-9B have varying implications with respect to the height selection.

Width 477 of cutting portion 470 at blade tip 474 may also vary from one application to another. The selection of the width may depend on various factors including, for example, the wire/ribbon material, the force of the cutting motion, amongst others. In one exemplary embodiment, width 477 may be slightly greater than a width of wire/ribbon 412 (e.g., 10% wider such that for a 2000 micron wide ribbon, width 477 may be selected to be about 2200 microns). Width 477 may also be equal to, or less than, the width of wire/ribbon 412, as desired in a given application.

Figure 4B:
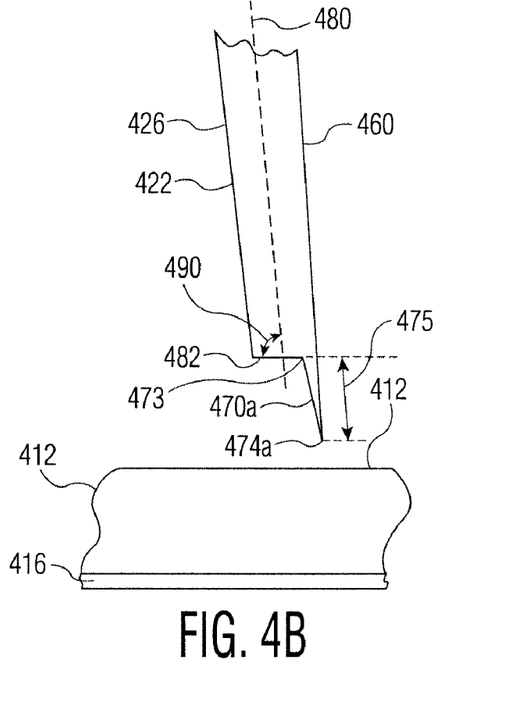
FIGS. 4B and 4C are side sectional views of a modified cutting blade similar to that shown in FIG. 4A prior to and after penetrating into a conductive material in accordance with an exemplary embodiment of the present invention.
Figure 4C:
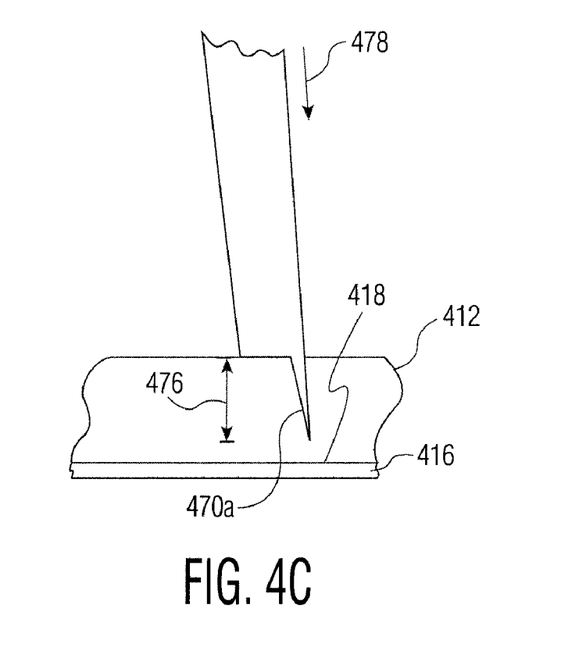

FIG. 4B illustrates cutting blade 426 prior to contact with conductive material 412 (wire or ribbon 412). FIG. 4C illustrates cutting portion 470a having pierced conductive material 412 at bonding location 418 to depth 476 (via application of downward cut force 478) without contacting or piercing underlying substrate 416 (e.g., where device 416 is a simplistic representation of any semiconductor device such as a die supported on a substrate). As shown in FIGS. 4B-4C, cutting blade 426 has body portion 460 including end portion 422. End portion 422 includes stepped portion 472 proximate cutting portion 470a (where cutting portion 470a terminates at blade tip 474*a*). Stepped portion 472 defines stepped surface 482, where the distance from stepped surface 482 to blade tip 474*a* defines height 475.

Stepped portion 472, including stepped surface 482, is configured to stop (or at least resist) penetration of blade tip 474*a* past the desired depth when surface 482 is in contact with conductive material 412. FIGS. 4B-4C also illustrate angle 490 which is defined between axis 480 and stepped surface 482. An exemplary range for angle 490 may be between 90-110 degrees, with the specific example shown in FIGS. 4B-4C being approximately 90 degrees.

FIGS. 4B-4C illustrate cutting blade 426 that is substantially similar to cutting blade 426 shown in FIG. 4A (with certain identical reference numbers); however, in FIGS. 4B-4C cutting portion 470*a* does not angle inward toward longitudinal axis 480 as does cutting portion 470 shown in FIG. 4A. Rather, in FIGS. 4B-4C cutting portion 470*a* continues on a substantially straight angled linear path.

Figure 5A:
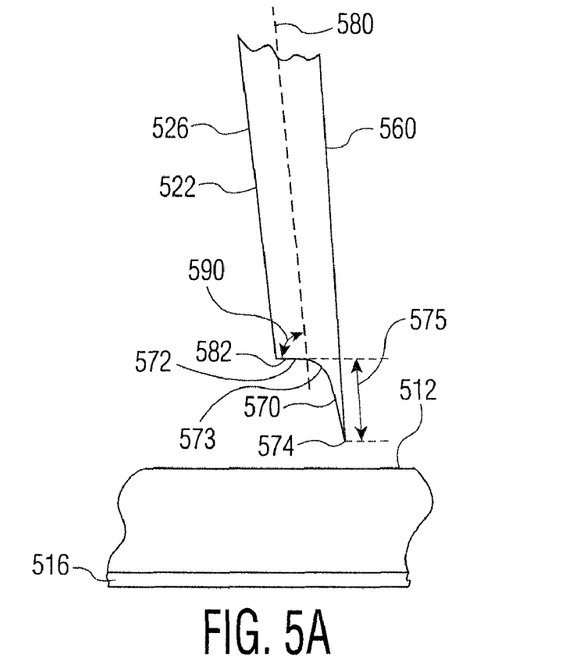
FIGS. 5A and 5B are side sectional views of another cutting blade prior to and after penetrating into a conductive material in accordance with an exemplary embodiment of the present invention.

FIGS. 5A-5B, 6A-6B, 7A-7B, 8A-8B, and 9A-9B are various exemplary alternative designs of stepped portions within the scope of the present invention having similar reference numbers in the series X72 (e.g., where "X" is the FIG. number and "72" is the specific element). For example, the cutting blade shown in FIG. 4A is numbered 426, while the cutting blade in FIG. 5A is numbered as 526. Such like numbered elements are analogous to each other unless indicated otherwise.

Figure 5B:
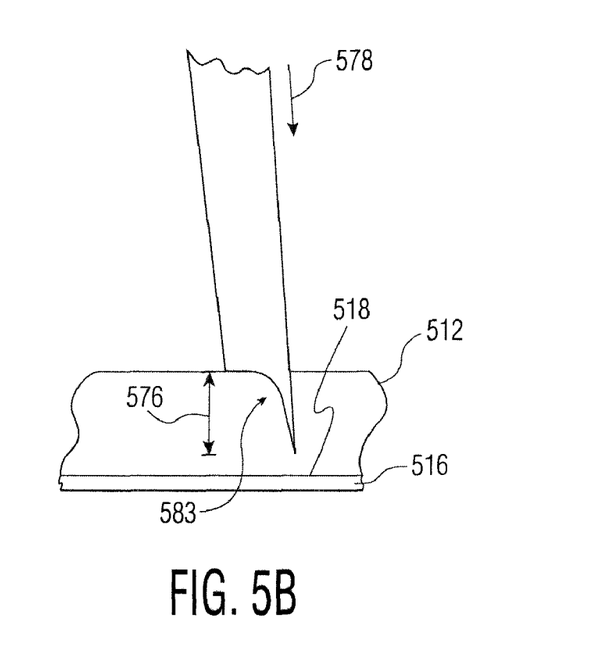

FIG. 5A illustrates cutting blade 526 prior to contact with conductive material 512. FIG. 5B illustrates cutting portion 570 (with height 575) having pierced conductive material 512 at bonding location 518. Cutting portion 570 has penetrated conductive material 512 to depth 576 (via the application of downward cut force 578) without contacting or piercing underlying substrate 516. Cutting blade 526 includes body portion 560, where body portion 560 includes end portion 522. End portion 522 includes stepped portion 572 proximate cutting portion 570, where cutting portion 570 terminates at blade tip 574. Stepped surface 582 of stepped portion 572 is substantially perpendicular to longitudinal axis 580, and angle 590 is approximately 90 degrees. Stepped surface 582 is positioned relative to blade tip 574 to delineate depth 576 that blade tip 574 cuts into wire or ribbon 512.

Cutting blade 526 is somewhat analogous to cutting blade 426 of FIGS. 4A-4C; however, juncture (or interface) 573 of cutting portion 570 and stepped portion 572 defines curved internal radius 583 (see FIG. 5B). Curved internal radius 583 may create a somewhat smoother increase in the resistance against cutting portion 570 penetrating further into conductive material 512 as compared to the exemplary embodiment illustrated in FIGS. 3 and 4A-4C. A "hard stop" may be effective once substantially perpendicular flat stepped surface 582 contacts conductive material 512.

Figure 6A:
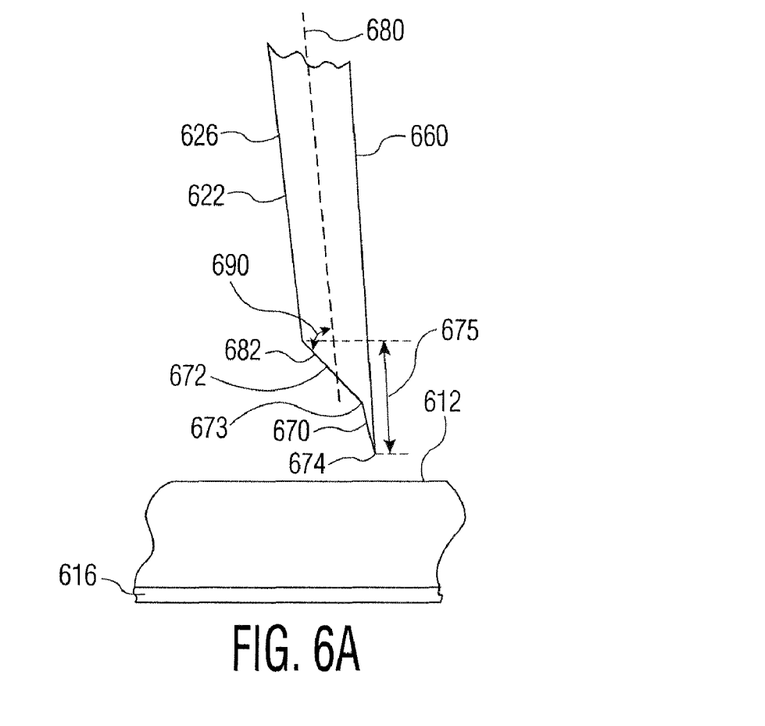
FIGS. 6A and 6B are side sectional views of yet another cutting blade prior to and after penetrating into a conductive material in accordance with an exemplary embodiment of the present invention.
Figure 6B:
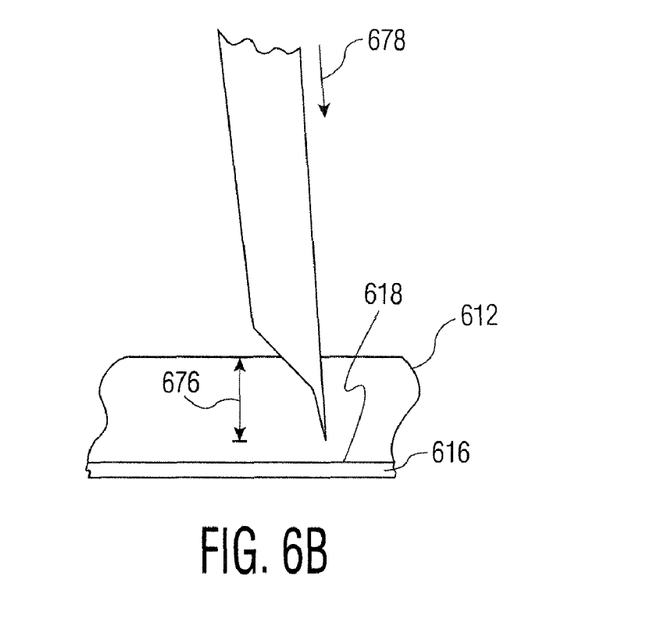

FIG. 6A illustrates cutting blade 626 prior to contact with conductive material 612. FIG. 6B illustrates cutting portion 670 having pierced conductive material 612 (at bonding location 618) to depth 676 via the application of downward cut force 678 without contacting or piercing underlying substrate 616. Cutting blade 626 includes body portion 660, where body portion 660 includes end portion 622. End portion 622 includes stepped portion 672 proximate cutting portion 670 (where cutting portion 670 terminates at blade tip 674). Juncture (or interface) 673 is defined between cutting portion 670 and stepped surface 682.

Cutting blade 626 is somewhat analogous to cutting blade 426 of FIGS. 4A-C; however stepped surface 682 defines angle 690 relative to longitudinal axis 680. Angle 690, if less than 90 degrees, may tend to provide a more gradual increase in the resistance during penetration of cutting portion 670 into conductive material 612. In one exemplary embodiment, stepped surface 682 may be from about 30-90 degrees relative to longitudinal axis 680. Other exemplary embodiments include ranges of about 50-90 degrees, and about 70-90 degrees. Height 675 is defined as the distance from blade tip 674 to the terminus of upwardly sloping stepped surface 682. Sloping stepped surface 682 may or may not act as a hard stop for ending a downward motion of cutting blade 626 into conductive material 612. Factors such as angle 690, the velocity/force of the cutting blade 626 toward cutting material 612, amongst others, may determine if surface 682 acts as a hard stop. If it does not act as a hard stop, surface 682 may serve to resist or slow further downward motion. Further, a wire bonding system including cutting blade 626 may be calibrated to cease the downward motion at a predetermined resistance to stop further penetration of blade 626 into conductive material 612.

While the above description with respect to FIGS. 4A-4C, 5A-5B, and 6A-6B relates to a blade tip on one side of a stepped portion (which may be desirable to position the blade tip very close to the bonding tool), a stepped portion may extend on both sides of the blade tip (or may extend around such blade tip either completely or partially in a flange-like arrangement). When the stepped portion extends on both sides of the blade tip, the portions of the stepped portion may be substantially similar to one another as shown in FIGS. 7A-7B, 8A-8B, and 9A-9B. Alternatively, the portions of the stepped portion may be different from one another. For example, the height (or shape, or angle, etc) of the stepped portion on one side of the blade tip may differ from the height of the stepped portion on the other side of the blade tip. Thus, it is clear that other such stepped portion/blade tip arrangements are possible within the teachings of the present invention.

Figure 7A:
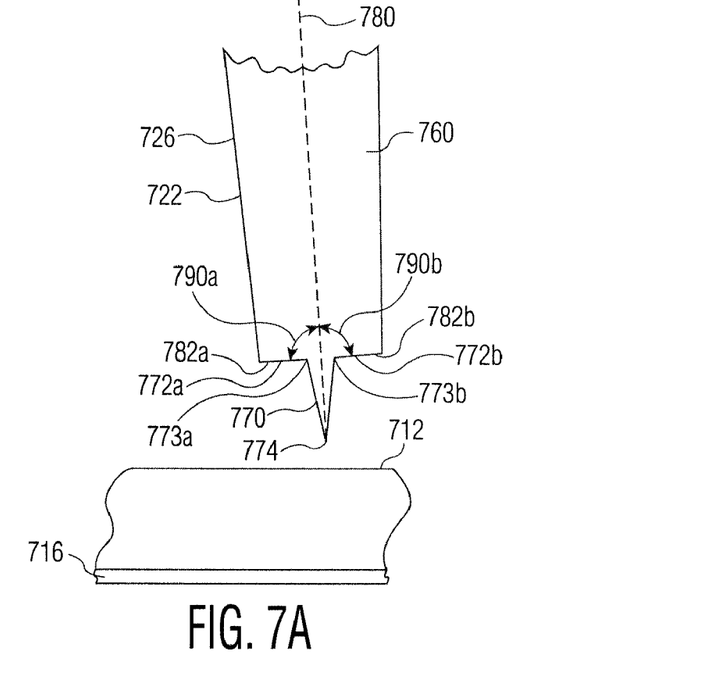
FIGS. 7A and 7B are side sectional views of yet another cutting blade prior to and after penetrating into a conductive material in accordance with an exemplary embodiment of the present invention.
Figure 7B:
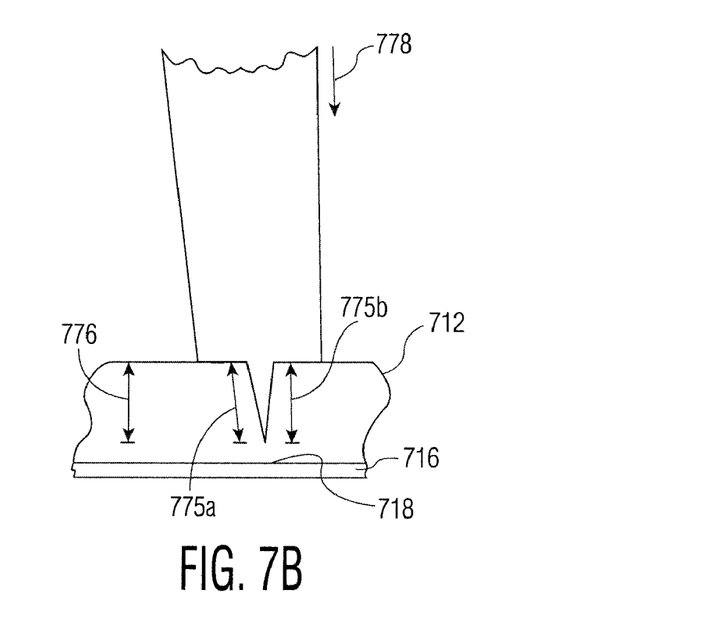

More specifically, FIG. 7A illustrates cutting blade 726 prior to contact with conductive material 712. FIG. 7B illustrates cutting portion 770 having pierced conductive material 712 (at bonding location 718) to depth 776 via the application of downward cut force 778 without contacting or piercing underlying substrate 716. Cutting blade 726 includes body portion 760, where body portion 760 includes end portion 722. End portion 722 includes cutting portion 770, where cutting portion 770 terminates at blade tip 774.

Cutting blade 726 is somewhat analogous to cutting blade 426 of FIGS. 4A-4C but with stepped portion extension 772*b* on another side of blade tip 774. Stepped portion extensions 772*a*, 772*b* define heights 775*a*, 775*b* of cutting portion 770 (See FIG. 7B). Stepped surfaces 782*a*, 782*b* of respective stepped portion extensions 772*a*, 772*b* each have a substantially flat shape from junctures 773*a*, 773*b* to an outer edge of the stepped surfaces. Angles 790*a*, 790*b* are defined by the angles of stepped surfaces 782*a*, 782*b* relative to longitudinal axis 780 of cutting blade 726. Angles 790*a*, 790*b* may be, for example, between 90-110 degrees (where exemplary angles 790*a*, 790*b* shown in FIGS. 7A-7B are approximately 90 degrees).

Thus, dual stepped portion extensions 772*a*, 772*b* may act as stops, and/or may significantly increase downward cut force 778 required to continue to push cutting blade 726 into wire or ribbon 712. Together stepped portion extensions 772*a*, 772*b* tend to effectively stop the cutting operation once desired cut depth 776 is achieved, thus providing a reasonable assurance that semiconductor device 716, for example, is not damaged.

Figure 8A:
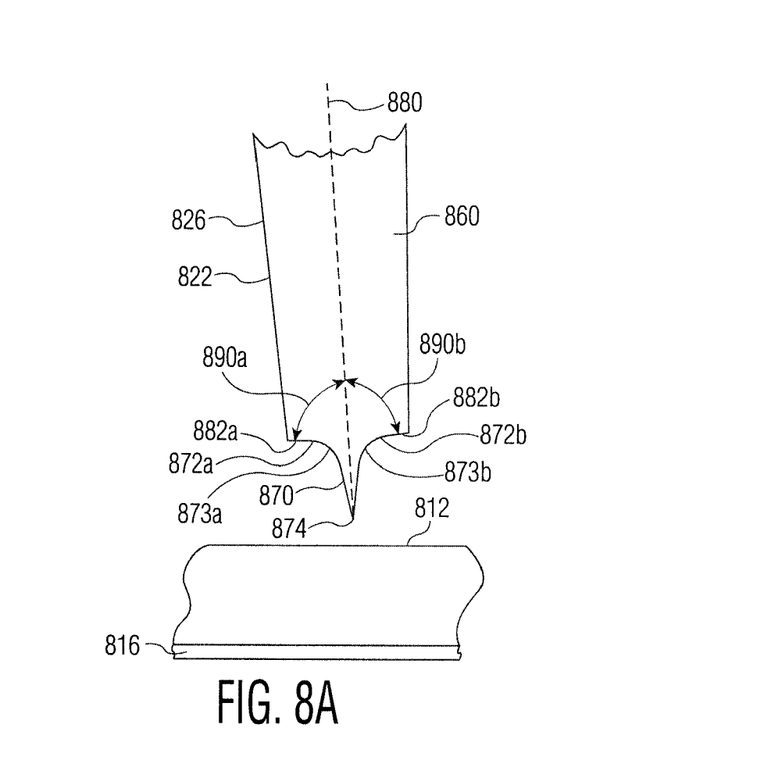
FIGS. 8A and 8B are side sectional views of yet another cutting blade prior to and after penetrating into a conductive material in accordance with an exemplary embodiment of the present invention.
Figure 8B:
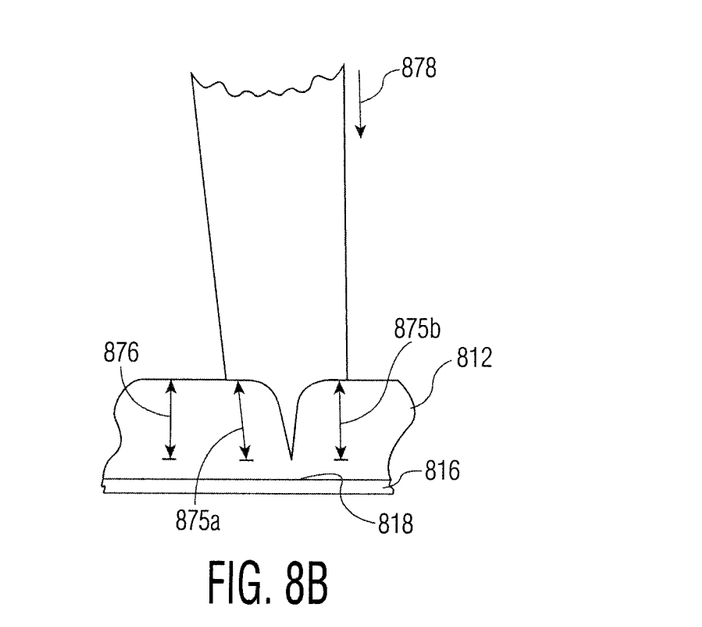

FIG. 8A illustrates cutting blade 826 prior to contact with conductive material 812. FIG. 8B illustrates cutting portion 870 having pierced conductive material 812 (at bonding location 818) to depth 876 via the application of downward cut force 878 without contacting or piercing underlying substrate 816. Cutting blade 826 includes body portion 860 (defining longitudinal axis 880), where body portion 860 includes end portion 822. End portion 822 includes cutting portion 870, where cutting portion 870 terminates at blade tip 874.

Cutting blade 826 is somewhat analogous to cutting blade 526 of FIGS. 5A-5B but with stepped portion extension 872b on another side of blade tip 874. Stepped portion extensions 872a, 872b define heights 875a, 875b. Further, stepped portion surfaces 882a, 882b of respective stepped portions 872a, 872b each define an arc from junctions 873a, 873b.

It is noted that the combination of arc-shaped stepped surfaces 882a, 882b may create a somewhat smooth increase in the resistance against cutting portion 870 penetrating further into conductive material 812 after initial contact of stepped surfaces 882a, 882b with conductive material 812. "Hard stops" may be effective once the respective upper terminal limits on stepped portions 872a, 872b contact conductive material 812. Thus, such hard stops alone, or in combination, may delineate depth 876 that blade tip 874 cuts into wire or ribbon 812.

Figure 9A:
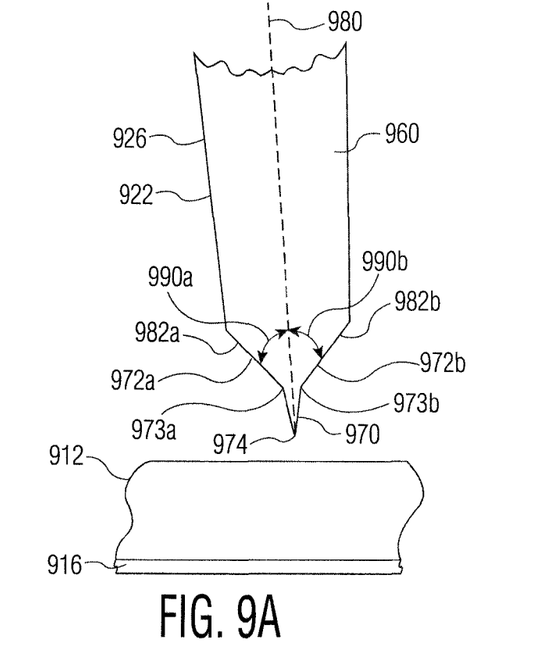
FIGS. 9A and 9B are side sectional views of yet another cutting blade prior to and after penetrating into a conductive material in accordance with an exemplary embodiment of the present invention.
Figure 9B:
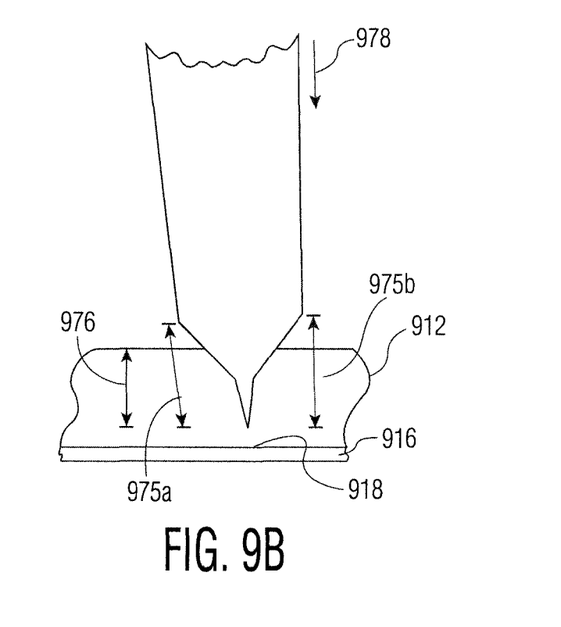

FIG. 9A illustrates cutting blade 926 prior to contact with conductive material 912. FIG. 9B illustrates cutting portion 970 having pierced conductive material 912 (at bonding location 918) to depth 976 via the application of downward cut force 978 without contacting or piercing underlying substrate 916. Cutting blade 926 includes body portion 960 (defining longitudinal axis 980), where body portion 960 includes end portion 922. End portion 922 includes cutting portion 970, where cutting portion 970 terminates at blade tip 974.

Cutting blade 926 is somewhat analogous to cutting blade 626 of FIGS. 6A-6B but with additional stepped portion extension 972b on another side of blade tip 974 to provide two stepped portion extensions 972a, 972b. Junctures (or interfaces) 973a, 973b are defined between cutting portion 970 and sloped stepped 982a, 982b.

Angles 990a, 990b are defined between axis 980 and each of sloped stepped 982a, 982b. In one exemplary embodiment, sloped surfaces 982a, 982b may be from about 30-90 degrees relative to longitudinal axis 980. Other exemplary embodiments include about 50-90 degrees, and about 70-90 degrees. Heights 975a, 975b are defined as the respective distances from blade tip 974 to the terminus of upwardly sloping stepped surfaces 982a, 982b.

Figure 10A:
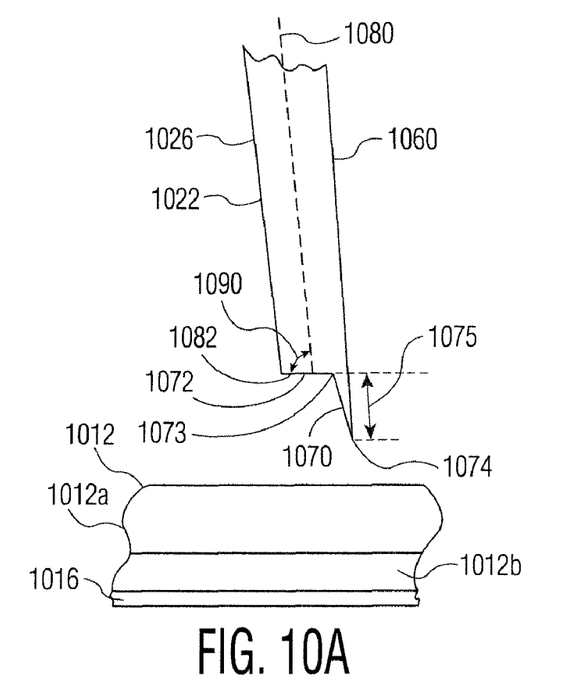
FIGS. 10A and 10B are side sectional views of yet another cutting blade prior to and after penetrating into a conductive material in accordance with an exemplary embodiment of the present invention.
Figure 10B:
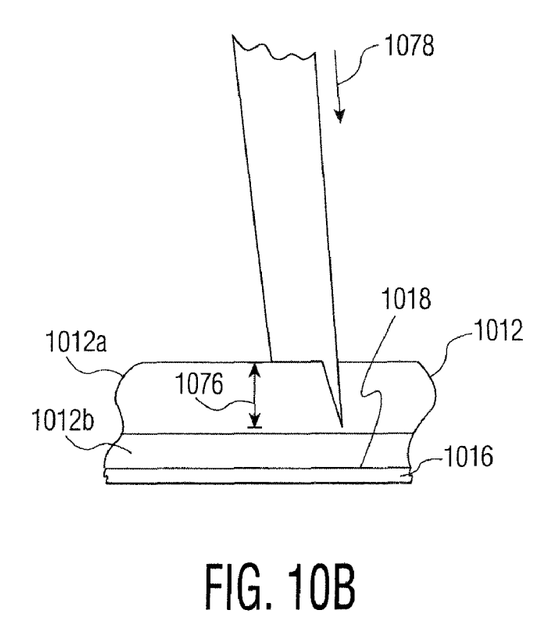

FIG. 10A illustrates cutting blade 1026 prior to contact with conductive material 1012. FIG. 10B illustrates cutting portion 1070 having pierced conductive material 1012 at bonding location 1018. Cutting portion 1070 penetrates conductive material 1012 to depth 1076 via the application of downward cut force 1078 without contacting or piercing underlying substrate 1016. Cutting blade 1026 includes body portion 1060 (defining longitudinal axis 1080), where body portion 1060 includes end portion 1022. End portion 1022 includes cutting portion 1070 (where cutting portion 1070 terminates at blade tip 1074). Juncture (or interface) 1073 is defined adjacent stepped portion 1072 (having stepped surface 1082). Stepped surface 1082 is positioned an angle 1090 (e.g., approximately a 90 degree angle) relative to longitudinal axis 1080.

Cutting blade 1026 is substantially similar to cutting blade 426 of FIGS. 4B-4C but the exemplary conductive material 1012 is a clad ribbon which includes upper layer 1012a and lower layer 1012b. For example, upper layer 1012a may be formed of a first material (e.g., copper) and lower layer 1012b may be formed of a second, different, material (e.g., aluminum). In such an example, upper copper layer 1012a may tend to benefit electrical conductivity while lower aluminum layer 1012b may tend to benefit bonding to a bonding location of semiconductor device 1016.

By using cutting blade 1026 in accordance with the teachings of the present invention, the amount of penetration into upper layer 1012a and into lower layer 1012b may be controlled, for example, to prevent penetration into semiconductor device 1016. More specifically, height 1075 of stepped portion 1072 may be selected to define depth 1076 so that blade tip 1074 penetrates a desired portion of conductive material 1012. For example, height 1075 may be selected to penetrate only a portion of upper layer 1012a, only the entire upper layer 1012a, the entire upper layer 1012a and a portion of lower layer 1012b, the entire upper layer 1012a and the entire lower layer 1012b, etc.

The detailed design of exemplary stepped portions described herein, and others within the scope of the present invention (including the height of the stepped portion above the blade tip), may be selected such that the blade tip only partially penetrates the interconnecting conductive material (e.g., the wire or ribbon material). In such a configuration the bond head may be raised to further tear the conductive material. In another example, the stepped portion may be selected such that the blade tip completely penetrates the conductive material, but not the underlying bonding location (e.g., not the die pad of a semiconductor die to which the wire/ribbon has been bonded). In yet another example, the stepped portion may be selected such that the blade tip completely penetrates the conductive material and contacts (or even partially penetrates) the underlying bonding location.

The detailed design of stepped portions in connection with the present invention (including the height of the stepped portion above the blade tip) may be used in conjunction with a wire bonding system having a downward cut force that may be calibrated for the cutting blade. For example, the force may be calibrated to not exceed a predetermined limit to ensure that the cutting blade does not extend downward beyond a desired position (e.g., to not penetrate the die). More specifically, based on the given design of the stepped portion (such as those illustrated in FIGS. 4A-4C, 5A-5B, 6A-6B, 7A-7B, 8A-8B, 9A-9B, and 10A-10B), the force may be calibrated differently to achieve the desired result (e.g., stopping of the downward motion).

Further, a feedback loop (either an active or passive feedback loop) may be used to monitor the resistance (e.g., momentary resistance, the rate of increase, etc.) to downward movement of the cutter blade. Once a predetermined threshold is reached (e.g., a given resistance value, a rate of increase value, etc.) further downward movement of the cutting blade may be stopped either actively (e.g., through motor control or the like) or passively (using mechanical compliance or the like).

Although the present invention has been described primarily in terms of cutting a conductive material bonded to a semiconductor die, it is not limited thereto. The teachings of the present invention have application in various semiconductor applications where a conductive material is bonded to any bonding location. Further, the teachings of the present invention may be used to protect the blade tip from excessive wear, for example, where the substrate is formed from a relatively hard material and may cause wear to the blade tip if the blade tip contacts the substrate.

Although the present invention has been illustrated and described primarily with respect to flat or smooth surfaced stepped surfaces it is not limited thereto. For example, the stepped surfaces may include portions that are curved, convex, concave, roughened, recessed, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A wire bonding system, including: a substrate;
a bonding tool for bonding a conductive material to a bonding location of the substrate, the conductive material including a wire or ribbon included in the wire bonding system; and
a cutting blade adjacent the bonding tool, the cutting blade including a body portion, the body portion including an end portion, the end portion having a blade tip, the blade tip configured to penetrate into the conductive material after the conductive material has been bonded to the bonding location, the end portion including a stepped portion proximate the blade tip configured to limit the penetration of the blade tip during use thereof, the stepped portion being substantially parallel to a horizontal surface of the conductive material bonded to the substrate.

2. The wire bonding system of claim 1 further including a conductive material guide adjacent the bonding tool for guiding the conductive material to the bonding tool, the cutting blade being positioned between the conductive material guide and the bonding tool.

3. The wire bonding system of claim 1 wherein the stepped portion is approximately perpendicular to a longitudinal axis of the cutting blade.

4. The wire bonding system of claim 3 wherein the end portion includes a cutting portion terminating at the blade tip, and wherein an interface between the cutting portion and the stepped portion includes a rounded internal radius.

5. The wire bonding system of claim 1 wherein the stepped portion is configured to prevent the blade tip from completely penetrating the conductive material.

6. The wire bonding system of claim 1 wherein the stepped portion has a height above the end of the blade tip that is between 50-100% of a thickness of the conductive material.

7. The wire bonding system of claim 1 wherein the blade tip is on one side of the stepped portion.

8. The wire bonding system of claim 1 wherein the blade tip is between the stepped portion and another stepped portion.

9. A wire bonding system, including:
a bonding tool for bonding a conductive material to a bonding location; and
a cutting blade adjacent the bonding tool, the cutting blade including a body portion, the body portion including an end portion, the end portion having a blade tip, the blade tip configured to penetrate into the conductive material after the conductive material has been bonded to the bonding location, the end portion including a stepped portion proximate the blade tip configured to limit the penetration of the blade tip during use thereof,
wherein the blade tip is between the stepped portion and another stepped portion.

10. The wire bonding system of claim 9 further including a conductive material guide adjacent the bonding tool for guiding the conductive material to the bonding tool, the cutting blade being positioned between the conductive material guide and the bonding tool.

11. The wire bonding system of claim 9 wherein the stepped portion is approximately perpendicular to a longitudinal axis of the cutting blade.

12. The wire bonding system of claim 9 wherein the end portion includes a cutting portion terminating at the blade tip, and wherein an interface between the cutting portion and the stepped portion includes a rounded internal radius.

13. The wire bonding system of claim 9 wherein the stepped portion is configured to prevent the blade tip from completely penetrating the conductive material.

14. The wire bonding system of claim 6 wherein the stepped portion is angled from about 30 to 90 degrees relative to a longitudinal axis of the cutting blade.

15. The wire bonding system of claim 9 wherein the stepped portion is angled from about 50 to 90 degrees relative to a longitudinal axis of the cutting blade.

16. The wire bonding system of claim 9 wherein the stepped portion is angled from about 70 to 90 degrees relative to a longitudinal axis of the cutting blade.

17. The wire bonding system of claim 9 wherein the stepped portion has a height above the end of the blade tip that is between 50-100% of a thickness of the conductive material.

18. A wire bonding system, including:
a bonding tool for bonding a conductive material to a bonding location, the conductive material including a wire or ribbon included in the wire bonding system; and
a cutting blade adjacent the bonding tool, the cutting blade including a body portion, the body portion including an end portion, the end portion having a blade tip, the blade tip configured to penetrate into the conductive material after the conductive material has been bonded to the bonding location, the end portion including a stepped portion proximate the blade tip configured to limit the penetration of the blade tip during use thereof,
wherein the stepped portion is approximately perpendicular to a longitudinal axis of the cutting blade.

19. The wire bonding machine of claim 18 wherein the end portion includes a cutting portion terminating at the blade tip, and wherein an interface between the cutting portion and the stepped portion includes a rounded internal radius.

20. The wire bonding system of claim 18 further including a conductive material guide adjacent the bonding tool for guiding the conductive material to the bonding tool, the cutting blade being positioned between the conductive material guide and the bonding tool.

* * * * *